(12) United States Patent
Morita et al.

(10) Patent No.: US 11,810,491 B2
(45) Date of Patent: *Nov. 7, 2023

(54) TFT SUBSTRATE INCLUDING A NON-RECTANGULAR ACTIVE REGION

(71) Applicant: Japan Display Inc., Tokyo (JP)

(72) Inventors: Tetsuo Morita, Minato-ku (JP); Hiroyuki Kimura, Minato-ku (JP)

(73) Assignee: Japan Display Inc., Tokyo (JP)

( * ) Notice: Subject to any disclaimer, the term of this patent is extended or adjusted under 35 U.S.C. 154(b) by 223 days.

This patent is subject to a terminal disclaimer.

(21) Appl. No.: 17/232,552

(22) Filed: Apr. 16, 2021

(65) Prior Publication Data

US 2021/0233452 A1 Jul. 29, 2021

Related U.S. Application Data

(63) Continuation of application No. 16/846,907, filed on Apr. 13, 2020, now Pat. No. 11,004,377, which is a (Continued)

(30) Foreign Application Priority Data

Oct. 27, 2017 (JP) .................................. 2017-207995

(51) Int. Cl.
  *G09G 3/20* (2006.01)
  *H10K 59/131* (2023.01)
  *H10K 59/121* (2023.01)

(52) U.S. Cl.
  CPC ........... *G09G 3/20* (2013.01); *H10K 59/1216* (2023.02); *H10K 59/131* (2023.02); *G09G 2300/0426* (2013.01); *G09G 2320/0233* (2013.01)

(58) Field of Classification Search
  CPC ............ G09G 3/20; G09G 2300/0426; G09G 2320/0233; G09G 2300/0842;
  (Continued)

(56) References Cited

U.S. PATENT DOCUMENTS

2009/0102824 A1 4/2009 Tanaka et al.
2012/0112988 A1 5/2012 Nakanishi
(Continued)

FOREIGN PATENT DOCUMENTS

JP   WO 2007/105700 A1   9/2007

OTHER PUBLICATIONS

International Search Report dated Sep. 25, 2018 in PCT/JP2018/028898 filed Aug. 1, 2018, 1 page.

*Primary Examiner* — Adam R. Giesy
(74) *Attorney, Agent, or Firm* — Maier & Maier, PLLC

(57) ABSTRACT

Different groups include the same type of control lines. The first control lines are arranged such that control lines of different types belonging to each of group are adjacent to each other. In the second area, the second control lines are arranged such that control lines of different types belonging to each group are adjacent to each other. In the non-display area, the second control lines are arranged such that control lines of the same type belonging to different groups are adjacent to each other. The capacitor electrode includes portions connected to each other and arranged in the second direction. Each portion faces each other for control lines of the same type adjacent in the non-display area. Any of the portions and any of the other portions differ in width in the first direction.

11 Claims, 11 Drawing Sheets

Related U.S. Application Data continuation of application No. PCT/JP2018/028898, filed on Aug. 1, 2018.

(58) Field of Classification Search
CPC ......... G09G 3/3233; G09G 2300/0819; G09G 2300/0861; G09G 2320/0223; H01L 27/3265; H01L 27/3276; H01L 51/50; G02F 1/1343; G02F 1/1368; G09F 9/30; H05B 33/02

See application file for complete search history.

(56) References Cited

U.S. PATENT DOCUMENTS

| | | |
|---|---|---|
| 2018/0190946 A1 | 7/2018 | Li |
| 2018/0342194 A1 | 11/2018 | Li |
| 2019/0096914 A1 | 3/2019 | Hosokawa |
| 2019/0265531 A1* | 8/2019 | Hara ................... G06F 3/0445 |
| 2019/0331974 A1 | 10/2019 | Furuta |

* cited by examiner

TFT SUBSTRATE INCLUDING A NON-RECTANGULAR ACTIVE REGION

CROSS-REFERENCE TO RELATED APPLICATION

This application is a continuation application of U.S. application Ser. No. 16/846,907, filed on Apr. 13, 2020, which is a continuation application of International Application PCT/JP2018/028898 filed on Aug. 1, 2018, which claims priority from Japanese patent application JP2017-207995 filed on Oct. 27, 2017. The contents of these applications are incorporated herein by reference in their entirety.

BACKGROUND OF THE INVENTION

1. Field of the Invention

The present invention relates to a display device.

2. Description of the Related Art

The display device is configured to input an image signal to a plurality of pixel electrodes corresponding to a selected scanning line. The scanning line includes a gate electrode at a position overlapping with a semiconductor layer of a thin film transistor for controlling the input of an image signal to a pixel electrode. When the display area is not rectangular, scanning lines of different lengths are mixed, and the numbers of thin film transistors and gate electrodes connected by the scanning lines are different (International Publication WO2007/105700).

Since a difference occurs in the load of the scanning line between the scanning lines having different lengths, a difference occurs in the fall of the pulse signal applied to the scanning line. For example, when the scanning line is short and the number of gate electrodes is small, the capacitive reactance is reduced. When the load on the scanning line is reduced, the fall of the gate signal pulse becomes sharp. As a result, a difference occurs in the voltage applied to the pixel electrode, and even with the same video signal, a luminance difference occurs depending on the scanning line.

In order to solve the above problem, it is conceivable to provide a dummy load on a short scanning line. However, when one pixel circuit is controlled by a plurality of scanning lines, an optimal load correction amount differs for each scanning line and the adjustment is difficult.

SUMMARY OF THE INVENTION

An object of the present invention is to simplify load adjustment.

The display device according to the present invention includes a display area having a non-rectangular shape in which a first area and a second area are joined, the second area being smaller than the first area in a first direction, and the second area being adjacent to the first area in a second direction orthogonal to the first direction; a non-display area adjacent to the second area in the first direction and adjacent to the first area in the second direction; a plurality of pixel circuits arranged in the display area in the first direction and the second direction, avoiding the non-display area; a plurality of first control lines each extending in the first direction through the first area, avoiding the second area; a plurality of second control lines each extending in the first direction through the second area and the non-display area, avoiding the first area; a capacitor electrode facing the plurality of second control lines in the non-display area; and an insulating film interposed between the plurality of second control lines and the capacitor electrode, in which a control line assembly of each set of the plurality of first control lines and the plurality of second control lines is divided into a plurality of groups each constituted of different types of control line assemblies connected to a corresponding assembly of the plurality of pixel circuits, different groups include the same type of control line assemblies, the plurality of first control lines are arranged such that control line assemblies of the different types belonging to each of the plurality of groups are adjacent to each other, the plurality of second control lines are arranged in the second area such that control line assemblies of the different types belonging to each of the plurality of groups are adjacent to each other, the plurality of second control lines are arranged in the non-display area such that control line assemblies of the same type belonging to the different groups are adjacent to each other, the capacitor electrode includes a plurality of portions connected to each other and arranged in the second direction, each of the plurality of portions faces each other in control line assemblies of the same type adjacent in the non-display area, and one of the plurality of portions and the other are different in the width in the first direction.

According to the present invention, in the non-display area, the plurality of second control lines are arranged such that control line assemblies of the same type are adjacent to each other, so that load adjustment can be simplified.

DETAILED DESCRIPTION OF THE INVENTION

Figure 1:
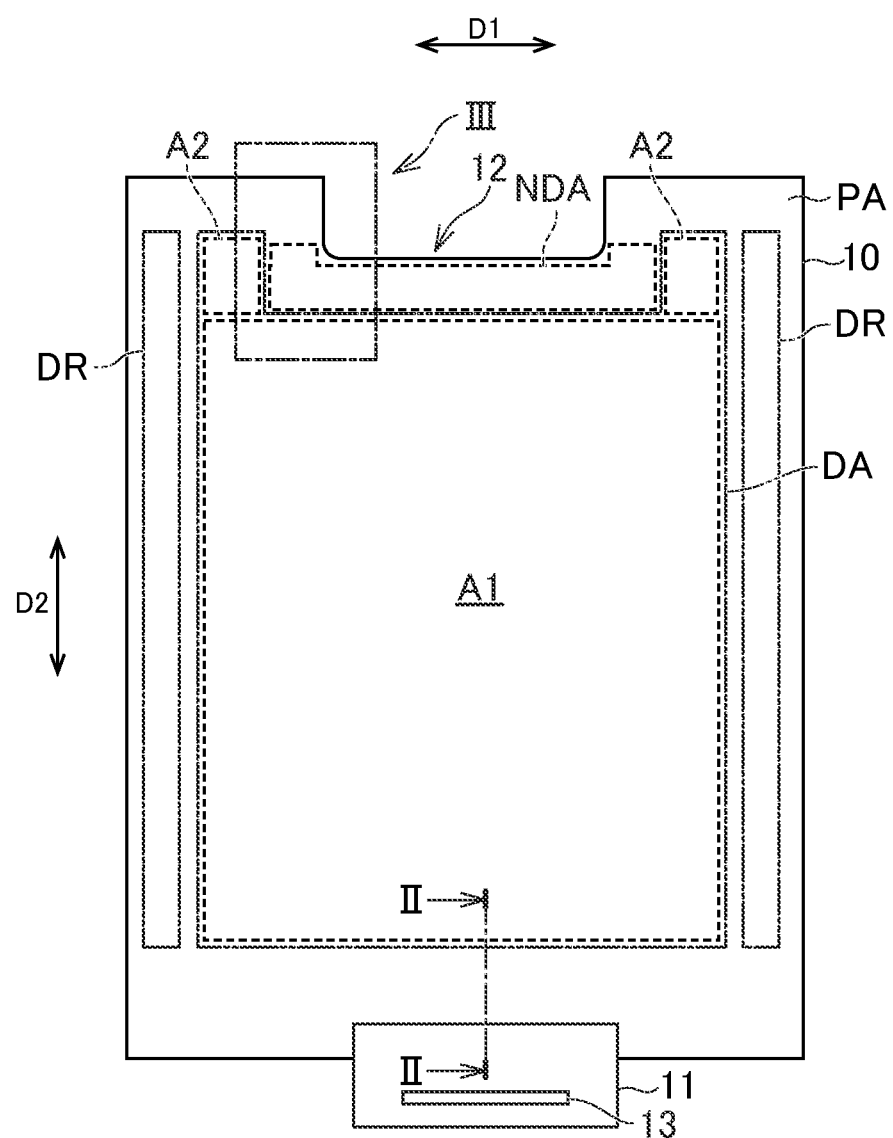
FIG. 1 is a plan view illustrating a display device according to a first embodiment to which the present invention is applied.

Hereinafter, embodiments of the present invention will be described with reference to the drawings. However, the present invention can be carried out in various modes without departing from the gist of the present invention, and is not to be construed as being limited to the description of the embodiments exemplified below.

The drawings may be schematically illustrated in terms of width, thickness, shape, and the like of each portion as compared with actual embodiments in order to make the description clearer, but are merely examples, and are not intended to limit the interpretation of the present invention. In the specification and the drawings, elements having the same functions as those described in relation to the already described drawings are denoted by the same reference numerals, and the redundant description may be omitted.

Furthermore, in the detailed description of the present invention, when defining the positional relationship between a certain component and another component, the terms "above" and "below" include not only the case where located directly above or below the certain component, but also the case where other components are further interposed therebetween unless otherwise specified.

First Embodiment

FIG. 1 is a plan view illustrating a display device according to a first embodiment to which the present invention is applied. The display device is configured to form a full-color pixel by combining unit pixels (sub-pixels) of a plurality of colors including, for example, red, green, and blue, and displays a full-color image.

The display device includes a display area DA where an image is displayed. The display area DA has a non-rectangular shape in which a first area A1 and a second area A2 are joined. The second area A2 is smaller than the first area A1 in a first direction D1. The second area A2 is adjacent to the first area A1 in a second direction D2 orthogonal to the first direction D1. The display area DA includes the second area A2 at an end in the second direction D2. The second area A2 has a front end in the second direction D2.

The display device includes a peripheral area PA around the display area DA. The peripheral area PA is outside the display area DA. In the peripheral area PA, a control circuit DR (or a scanning circuit or a gate driver circuit) is provided. The flexible printed circuit board 11 is connected to the peripheral area PA. An integrated circuit 13 is mounted on the flexible printed circuit board 11.

The peripheral area PA includes a non-display area NDA. The non-display area NDA is adjacent to the second area A2 in the first direction D1, and is adjacent to the first area A1 in the second direction D2. A substrate 10 includes a notch 12 adjacent to the non-display area NDA in the second direction D2. The notch 12 is adjacent to apart of the second area A2 (the front end in the second direction D2) in the first direction D1. The notch 12 is not adjacent to the second area A2 in the second direction D2.

Figure 2:
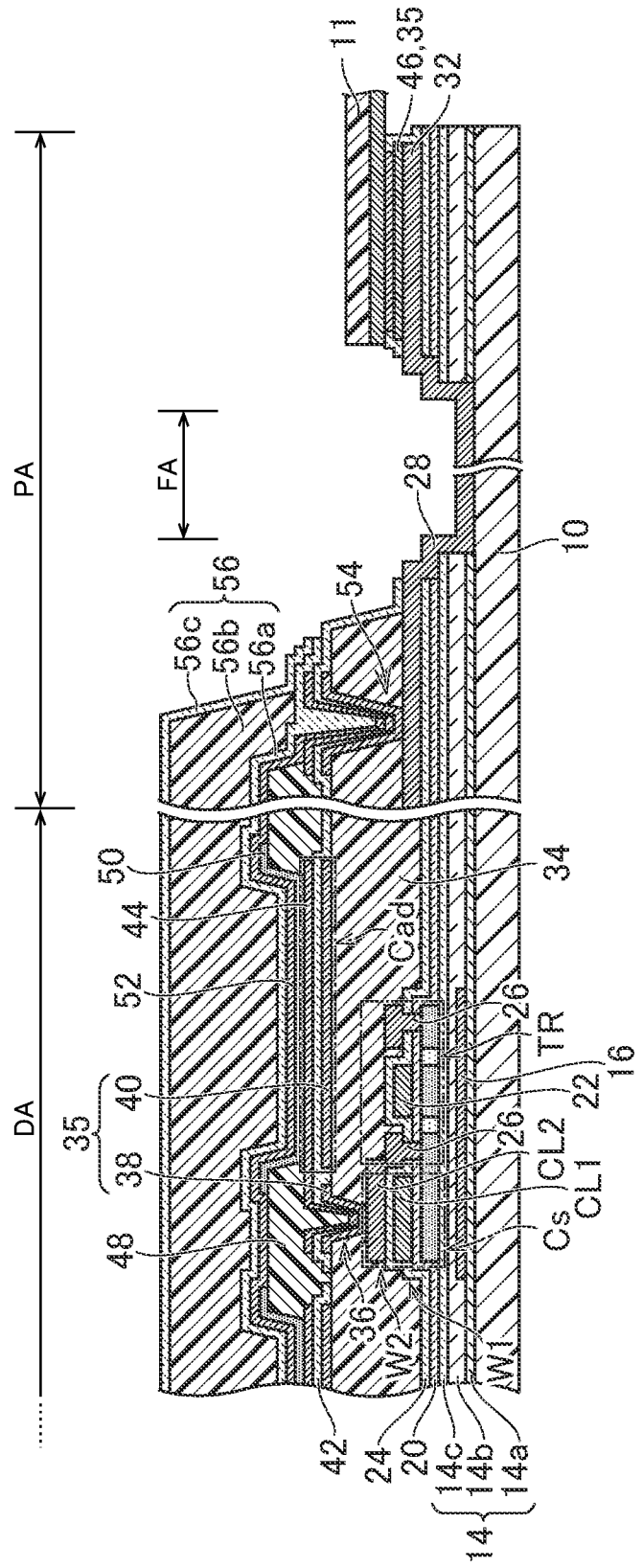
FIG. 2 is a cross-sectional view taken along line II-II of the display device illustrated in FIG. 1.

FIG. 2 is a cross-sectional view taken along line II-II of the display device illustrated in FIG. 1. Polyimide is used as a material of the substrate 10 (array substrate) and another substrate (opposite substrate, not illustrated). However, another resin material may be used as long as the material has sufficient flexibility to constitute a sheet display or a flexible display.

On the substrate 10, a three-layer laminated structure of a silicon oxide film 14a, a silicon nitride film 14b, and a silicon oxide film 14c is provided as an undercoat layer 14. The lowermost silicon oxide film 14a is provided for improving adhesion to the substrate 10, the intermediate silicon nitride film 14b is provided as a block film against moisture and impurities from the outside, and the uppermost silicon oxide film 14c is provided as a block film for preventing hydrogen atoms contained in the silicon nitride film 14b from diffusing to a semiconductor layer 18 side of a thin film transistor TR. However, the structure is not particularly limited to this structure, and may be further laminated, or may be a single layer or a two-layer laminate.

Under the undercoat layer 14, an additional film 16 may be formed at a position where the thin film transistor TR is formed. The additional film 16 can suppress a change in the characteristics of the thin film transistor TR due to the intrusion of light from the back surface of the channel, or can give a back gate effect to the thin film transistor TR by being formed of a conductive material and giving a predetermined potential. Here, after forming the silicon oxide film 14a, the additional film 16 is formed in an island shape in accordance with the position where the thin film transistor TR is to be formed, and then the silicon nitride film 14b and the silicon oxide film 14c are laminated, and thus, the additional film 16 is formed to be sealed in the undercoat layer 14. The present invention is not limited thereto. The additional film 16 may be first formed on the substrate 10, and then the undercoat layer 14 may be formed.

The thin film transistor TR is formed on the undercoat layer 14. Only an Nch transistor is illustrated here by taking a polysilicon thin film transistor as an example, but a Pch transistor may be formed at the same time. The semiconductor layer 18 of the thin film transistor TR has a structure in which a low-concentration impurity region is provided between a channel region and a source and drain region. Here, a silicon oxide film is used as a gate insulating film 20. A gate electrode 22 is a part of a first wiring layer W1 formed of MoW. The first wiring layer W1 includes a first storage capacitance line CL1 in addition to the gate electrode 22. A part of a storage capacitor Cs is formed between the first storage capacitance line CL1 and the semiconductor layer 18 (source and drain region) via the gate insulating film 20.

On the gate electrode 22, an interlayer insulating film 24 (silicon oxide film and silicon nitride film) is laminated. When allowing the substrate 10 to be bent, at least a part of the interlayer insulating film 24 is removed in a bending area FA to be easily bent. Since the undercoat layer 14 is exposed by removing the interlayer insulating film 24, at least a part thereof is also removed by patterning. After removing the undercoat layer 14, the polyimide constituting the substrate 10 is exposed. In some cases, the polyimide surface may be partially eroded through etching of the undercoat layer 14 to reduce the film thickness.

On the interlayer insulating film 24, a second wiring layer W2 including a portion serving as a source and drain electrode 26 and a routing wiring 28 is formed. Here, a three-layer laminated structure of Ti, Al and Ti is employed. The first storage capacitance line CL1 (part of the first wiring layer W1) and a second storage capacitance line CL2 (part of the second wiring layer W2) form a part of another storage capacitor Cs via the interlayer insulating film 24. The routing wiring 28 extends to an end of the substrate 10 to include a terminal 32 for connecting the flexible printed circuit board 11.

A planarizing film 34 is provided to cover the source and drain electrode 26 and the routing wiring 28 (except for a part thereof). As the planarizing film 34, an organic material such as photosensitive acrylic is often used because the organic material has better surface planarization than an inorganic insulating material formed by chemical vapor deposition (CVD) or the like.

The planarizing film 34 is removed at a pixel contact portion 36 and the peripheral area PA, and an indium tin oxide (ITO) film 35 is formed thereon. The indium tin oxide film 35 includes a first transparent conductive film 38 and a second transparent conductive film 40 separated from each other.

The second wiring layer W2 whose surface is exposed by removing the planarizing film 34 is covered with the first transparent conductive film 38. A silicon nitride film 42 is provided on the planarizing film 34 to cover the first transparent conductive film 38. The silicon nitride film 42 has an opening in the pixel contact portion 36, and a pixel electrode 44 is laminated so as to be conducted to the source and drain electrode 26 through the opening. The pixel electrode 44 is formed as a reflective electrode and has a three-layer laminated structure of an indium zinc oxide film, an Ag film, and an indium zinc oxide film. Here, the indium tin oxide film 35 may be used instead of the indium zinc oxide film. The pixel electrode 44 extends laterally from the pixel contact portion 36 and reaches above the thin film transistor TR.

The second transparent conductive film 40 is provided adjacent to the pixel contact portion 36, below the pixel electrodes 44 (further below the silicon nitride film 42). The second transparent conductive film 40, the silicon nitride film 42, and the pixel electrode 44 are overlapped to form an additional capacitor Cad.

On the surface of the terminal 32, a third transparent conductive film 46 which is another part of the indium tin oxide film 35 is formed. The third transparent conductive film 46 is formed simultaneously with the first transparent conductive film 38 and the second transparent conductive film 40. The third transparent conductive film 46 on the terminal 32 is provided as a barrier film so that an exposed portion of the terminal 32 is not damaged in a subsequent process. At the time of patterning the pixel electrode 44, the third transparent conductive film 46 is exposed to an etching environment. However, the indium tin oxide film 35 has sufficient resistance to the etching of the pixel electrode 44 by an annealing process performed between the formation of the indium tin oxide film 35 and the formation of the pixel electrode 44.

On the planarizing film 34, for example, above the pixel contact portion 36, an insulating layer 48 which is called a bank (rib) and serves as a partition between adjacent pixel regions is formed. As the insulating layer 48, photosensitive acrylic or the like is used similarly to the planarizing film 34. The insulating layer 48 is opened to expose the surface of the pixel electrode 44 as a light emitting region, and the opening end preferably has a gentle taper shape. If the opening end has a steep shape, poor coverage of an organic electro luminescence (EL) layer 50 formed thereon will occur.

The planarizing film 34 and the insulating layer 48 are in contact through an opening provided in the silicon nitride film 42 therebetween. Thus, moisture and gas desorbed and degassed from the planarizing film 34 can be extracted through the insulating layer 48 by heat treatment or the like after the formation of the insulating layer 48.

The organic EL layer 50 made of an organic material is laminated on the pixel electrode 44. The organic EL layer 50 may be a single layer, or may have a structure in which a hole transport layer, a light emitting layer, and an electron transport layer are sequentially laminated from the pixel electrode 44 side. These layers may be formed by vapor deposition, may be formed by coating over a solvent dispersion, or may be formed selectively with respect to the pixel electrode 44 (each sub-pixel). Alternatively, these layers may be formed by solid formation on the entire surface covering the display area DA. In the case of solid formation, white light can be obtained in all sub-pixels, and a desired color wavelength portion can be extracted by a color filter (not illustrated).

A counter electrode 52 is provided on the organic EL layer 50. Here, the counter electrode 52 is transparent due to the top emission structure. For example, the Mg layer and the Ag layer are formed as films thin to an extent that transmits light emitted from the organic EL layer 50. According to the above-described order of forming the organic EL layer 50, the pixel electrode 44 serves as an anode and the counter electrode 52 serves as a cathode. The counter electrode 52 is formed over the display area DA and over a cathode contact portion 54 provided near the display area DA. The counter electrode 52 is connected to the lower routing wiring 28 at the cathode contact portion 54 and electrically connected to the terminal 32.

A sealing film 56 is formed on the counter electrode 52. One function of the sealing film 56 is to prevent the previously formed organic EL layer 50 from the intrusion of moisture from the outside, and a high gas barrier property is required. Here, the laminated structure including the silicon nitride film is a laminated structure of a silicon nitride film 56a, an organic resin layer 56b, and a silicon nitride film 56c. A silicon oxide film or an amorphous silicon layer may be provided between the silicon nitride films 56a and 56c and the organic resin layer 56b for the purpose of improving adhesion.

If necessary, a cover glass, a touch panel substrate or the like may be provided on the sealing film 56. In this case, in order to fill the gap between the sealing film 56 and the cover glass or the touch panel, a filler using a resin or the like may be interposed.

Figure 3:
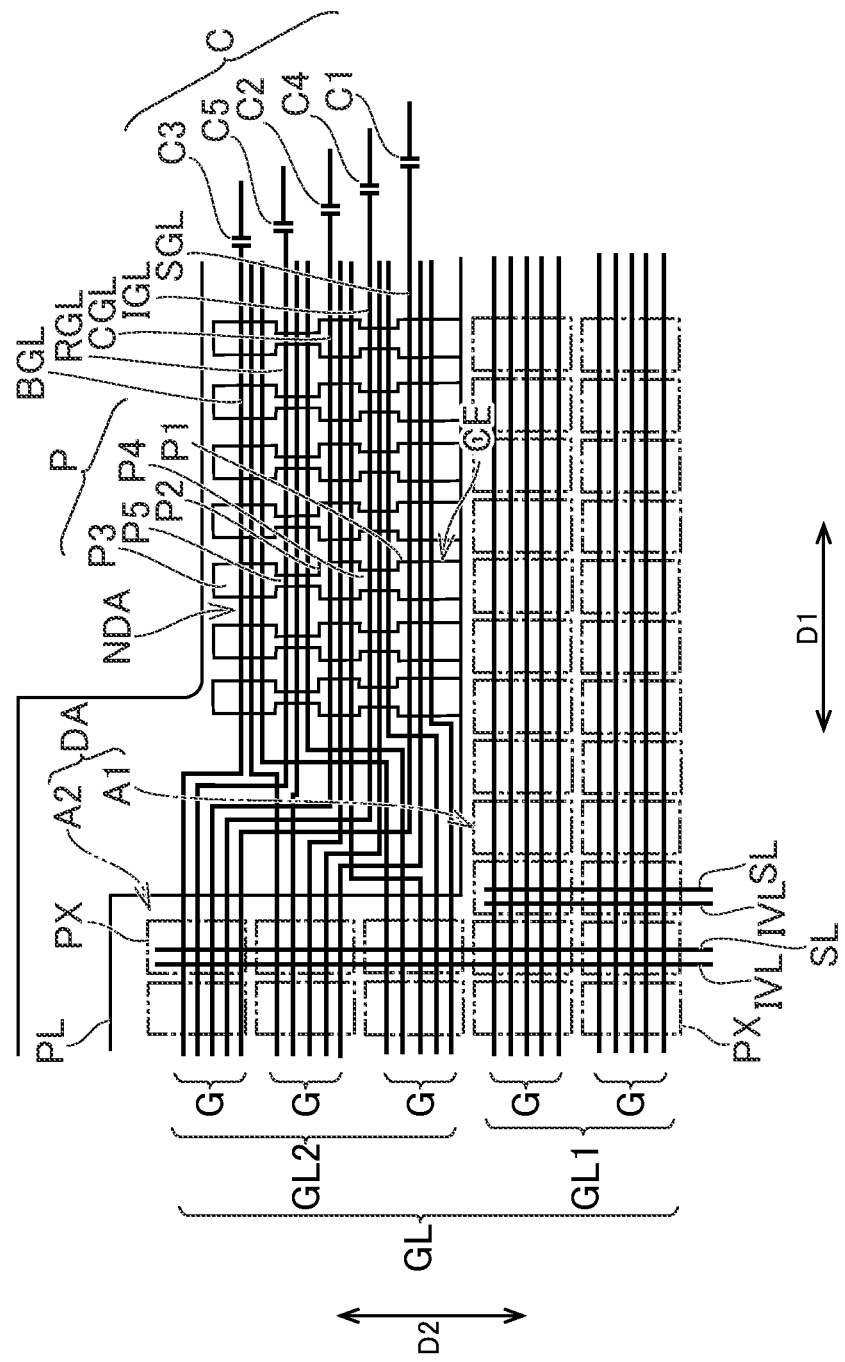
FIG. 3 is an enlarged view of a portion indicated by III in FIG. 1.

FIG. 3 is an enlarged view of a portion indicated by III in FIG. 1. A plurality of pixel circuits PX are arranged in the display area DA in the first direction D1 and the second direction D2, avoiding the non-display area NDA. In the display area DA, a plurality of control lines GL (scanning lines) each extend in the first direction D1. The details will be described later. A plurality of signal lines SL and initialization potential lines IVL are provided in a direction intersecting the plurality of control lines GL, and respectively extend in the second direction D2.

Figure 4:
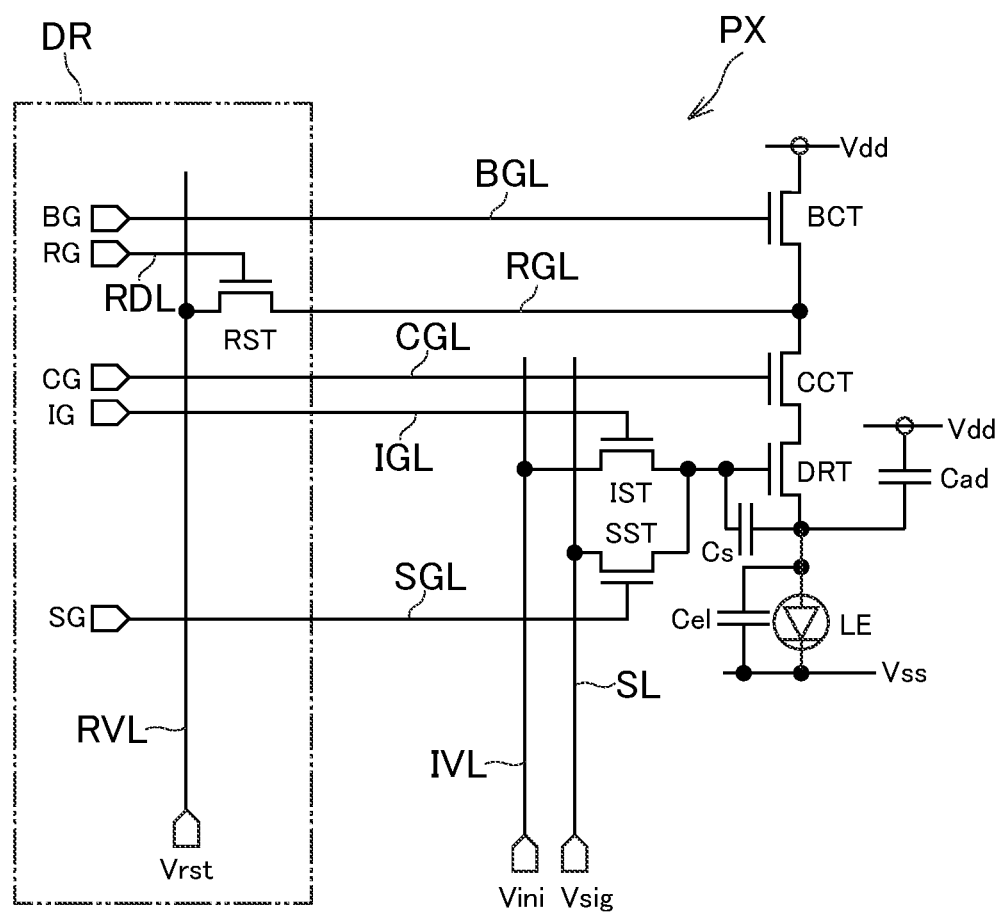
FIG. 4 is a diagram illustrating details of a pixel circuit.

FIG. 4 is a diagram illustrating details of the pixel circuit PX. Signals BG, CG, IG, and SG are output from the control circuit DR to a light emission control line BGL, a correction control line CGL, an initialization control line IGL, and a write control line SGL, respectively.

The pixel circuit PX includes a light emission control transistor BCT, a correction transistor CCT, an initialization transistor IST, a write transistor SST, and a drive transistor DRT. At least one of these transistors may be shared between adjacent pixel circuits PX. The storage capacitor Cs is provided between the gate and source of the drive transistor DRT. A parasitic capacitor Cel is a capacitor between the anode and the cathode of a light emitting element LE.

The light emission control transistor BCT, the correction transistor CCT, the initialization transistor IST, and the write transistor SST function as switching elements for selecting conduction or non-conduction between two nodes. The drive transistor DRT functions as a current control element that controls the value of the current flowing through the light emitting element LE according to the gate-source voltage. Here, all are formed using a thin film transistor. Further, these transistors are all formed by N-type transistors, but P-type transistors may be used. In the case of using a P-type transistor, the connection of the power supply potential and the storage capacitor may be appropriately adjusted.

The anode of the light emitting element LE is connected to a high potential power supply voltage Vdd via the light emission control transistor BCT, the correction transistor CCT, and the drive transistor DRT. The cathode is connected to a low potential power supply voltage Vss.

Figure 5:
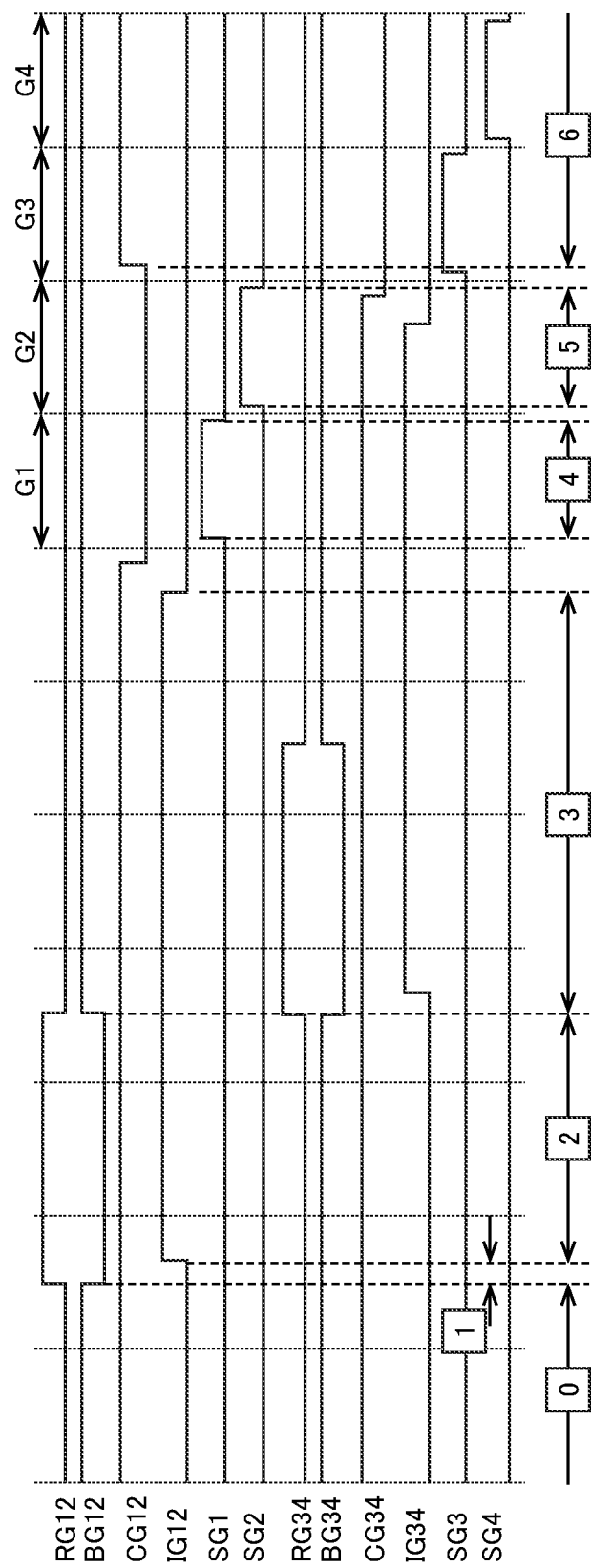
FIG. 5 is a diagram illustrating a timing chart of a control circuit for driving the pixel circuit.

FIG. 5 is a diagram illustrating a timing chart of the control circuit DR for driving the pixel circuit PX. In the present embodiment, the signals RG, BG, CG, and IG are simultaneously input to the pixel circuit PX assemblies arranged in two rows, respectively. The two-digit number attached after the reference numerals RG, BG, CG, and IG indicates the row number to which each signal is input. The one-digit number attached after a reference numeral SG indicates the row number to which the signal is input. Each section indicated by reference numerals G1 to G4 is one horizontal period, and the same timing relationship continues until the last row, although omitted hereafter. In FIG. 5, Periods 0 to 6 will be described in detail below.

[Light Emission in Previous Frame]

In FIG. 5, until the processing in a certain frame period is started (Period 0), the light emitting element LE keeps the light emitting state of the previous frame.

[Source Initialization of Drive Transistor DRT]

Figure 6:
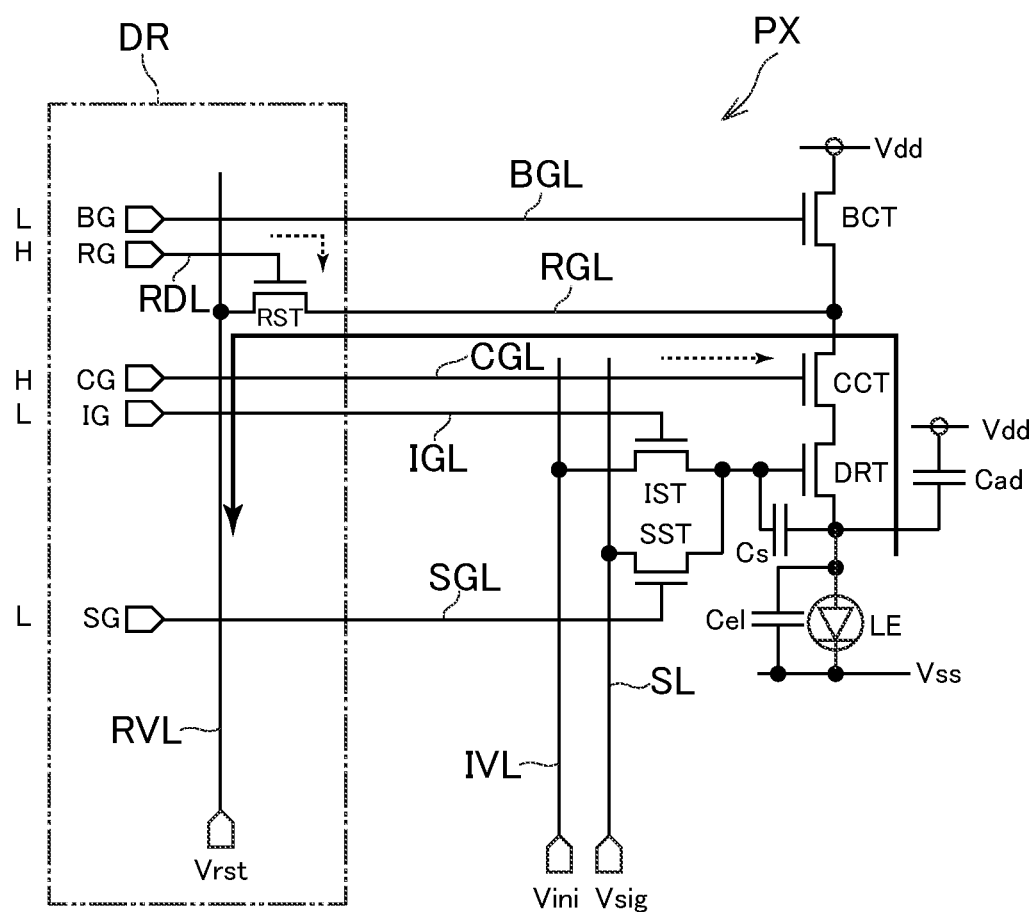
FIG. 6 is a diagram illustrating an operation in Period 1 in FIG. 5.

FIG. 6 is a diagram illustrating the operation in Period 1 in FIG. 5. In this period, first, the signal BG is at the L level, the signal CG is at the H level, the signal RG is at the H level, the light emission control transistor BCT is turned off, and the correction transistor CCT is turned on. The signal RG becomes H level, and a reset transistor RST is turned on via a reset drive line RDL. The reset transistor RST is provided outside the display area DA, for example, one for each row. The current from the power supply voltage Vdd is cut off by the light emission control transistor BCT, and the light emission of the light emitting element LE stops. The charge remaining on the anode side of the light emitting element LE is drawn out to a reset potential line RVL through the reset control line RGL and the reset transistor RST. As a result, the source of the drive transistor DRT is fixed at a reset potential Vrst. The reset potential Vrst is set to a potential lower than the light emission start voltage of the light emitting element LE with respect to the power supply voltage Vss.

[Gate Initialization of Drive Transistor DRT]

Figure 7:
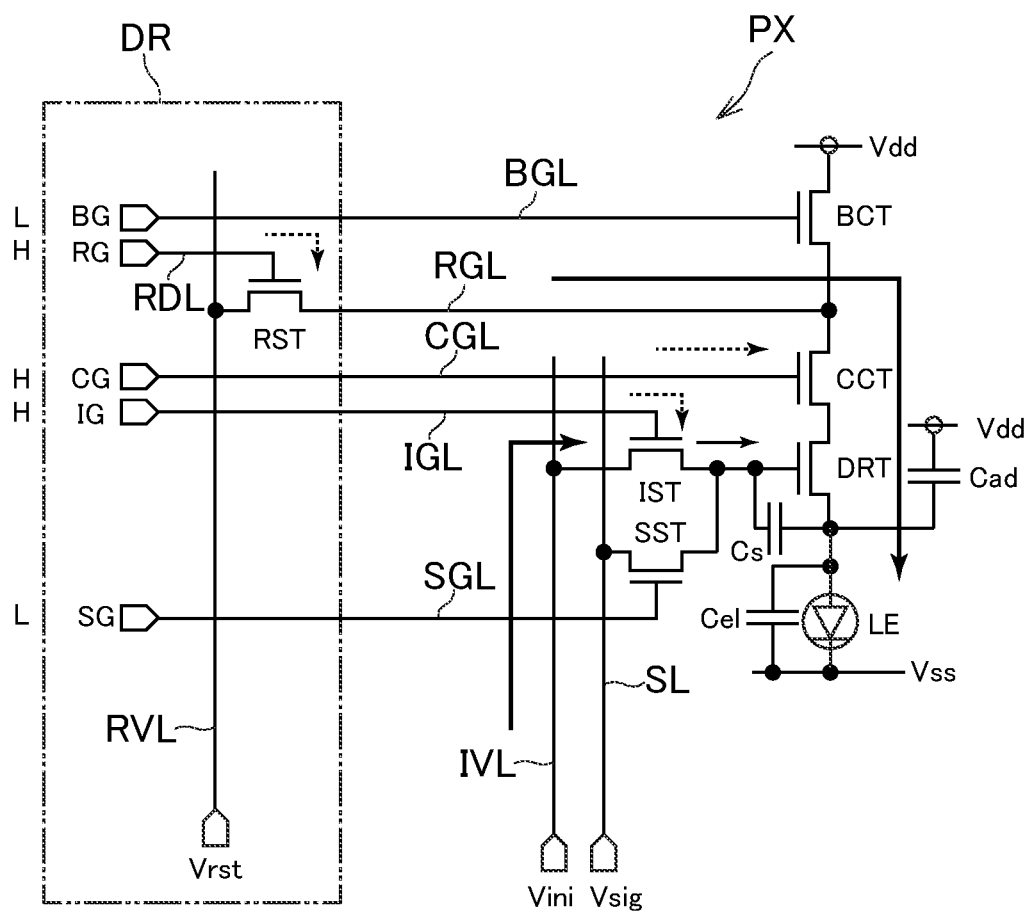
FIG. 7 is a diagram illustrating an operation in Period 2 in FIG. 5.

FIG. 7 is a diagram illustrating the operation in Period 2 in FIG. 5. In this period, the signal IG is at the H level, and the initialization transistor IST is turned on. As a result, the gate of the drive transistor DRT is fixed at an initialization potential Vini via the initialization potential line IVL. The initialization potential Vini is set to a potential higher than a threshold Vth of the drive transistor DRT with respect to the reset potential Vrst. That is, this operation turns on the drive transistor DRT. However, since the light emission control transistor BCT is turned off, no current flows into the drive transistor DRT yet.

[Offset Cancellation]

Figure 8:
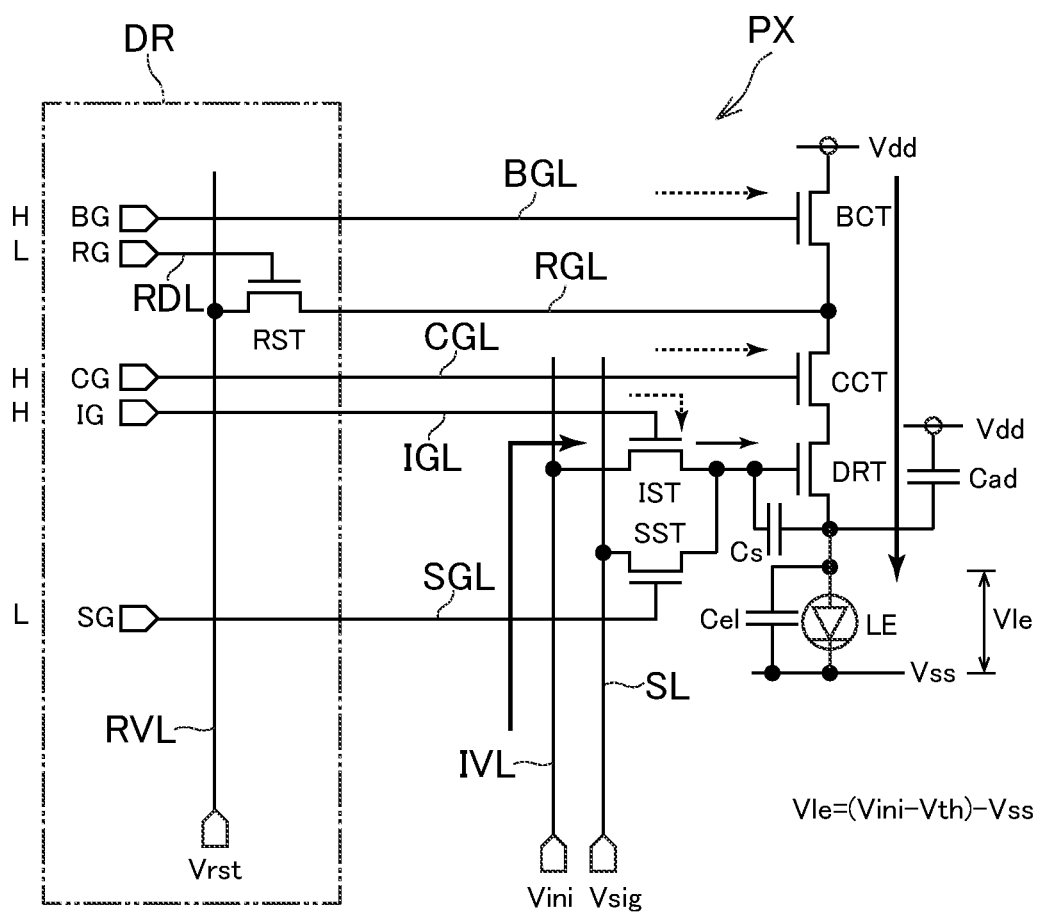
FIG. 8 is a diagram illustrating an operation in Period 3 in FIG. 5.

FIG. 8 is a diagram illustrating the operation in Period 3 in FIG. 5. In this period, the signal BG is at the H level and the signal RG is at the L level, the light emission control transistor BCT is turned on, and the reset transistor RST is turned off. Since the drive transistor DRT is turned on by the previous operation, a current is supplied from the power supply voltage Vdd to the drive transistor DRT through the light emission control transistor BCT and the correction transistor CCT.

At this stage, since the voltage between the anode and the cathode of the light emitting element LE does not exceed the light emission start voltage, no current flows. Therefore, the source of the drive transistor DRT is charged by the current supplied from the power supply voltage Vdd, and the potential of the drive transistor DRT rises. At this time, since the gate potential of the drive transistor DRT is the initialization potential Vini, the drive transistor DRT is turned off when the source potential of the drive transistor DRT becomes (Vini−Vth), and the increase of the source potential stops.

Since the threshold voltage Vth of the drive transistor DRT varies depending on the pixel circuit PX, the potential of the source of the drive transistor DRT when the increase of the potential stops is different depending on the pixel circuit PX. That is, by this operation, a voltage corresponding to the threshold voltage Vth of the drive transistor DRT in each pixel circuit PX is obtained between the source and the gate.

At this time, a voltage Vle of $\{(Vini-Vth)-Vss\}$ is applied between the anode and the cathode of the light emitting element LE. However, since this voltage does not yet exceed the light emission start voltage, no current flows into the light emitting element LE.

According to the timing chart of FIG. 5, the operation from the source initialization (Period 1) to the offset cancellation (Period 3) of the drive transistor DRT is performed in parallel for the pixel circuit PX assemblies corresponding to two rows, but is not limited thereto. The processing may be performed sequentially for each row, or three or more rows may be performed in parallel.

[Video Signal Write]

Figure 9:
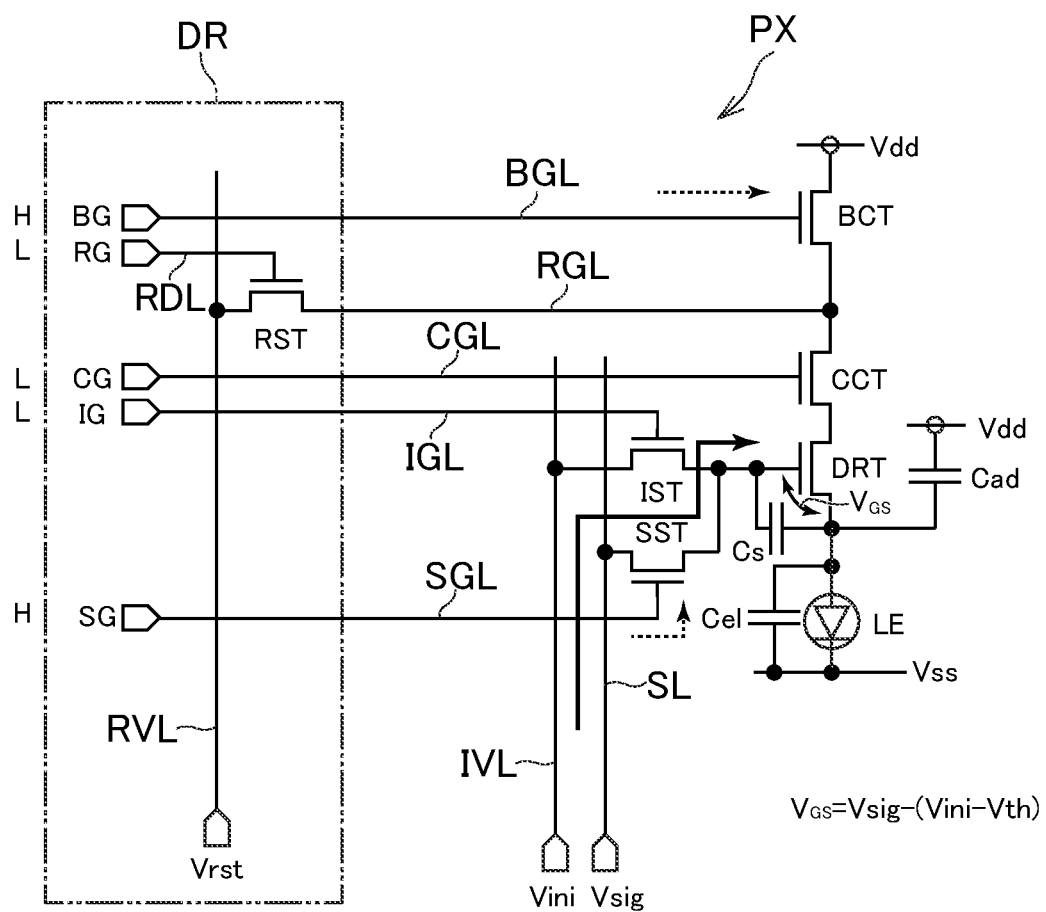
FIG. 9 is a diagram illustrating an operation in Periods 4 and 5 in FIG. 5.

FIG. 9 is a diagram illustrating the operation in Periods 4 and 5 in FIG. 5. In this period, the signal CG is at the L level, the signal IG is at the L level, the signal SG is at the H level, the correction transistor CCT is turned off, the initialization transistor IST is turned off, and the write transistor SST is turned on. As a result, a video signal Vsig is input to the gate of the drive transistor DRT, and the gate potential of the drive transistor DRT changes from the initialization potential Vini to the video signal Vsig. That is, the video signal Vsig is written to the gate of the drive transistor DRT.

At this time, through the previous offset cancellation (Period 3), the source potential of the drive transistor DRT has a potential (Vini−Vth) corresponding to the value of the threshold voltage Vth. Therefore, even if the same video signal Vsig is written, a gate-source voltage $V_{GS}$ of the drive transistor DRT becomes $\{Vsig-(Vini-Vth)\}$ reflecting the variation of the threshold voltage Vth. That is, even if there is a variation in the threshold voltage Vth between the pixel circuits PX, it is possible to perform corrected writing corresponding to the variation.

In Period 4, writing of the first row is performed, and in Period 5, writing of the second row is performed. Similarly, after the odd-numbered row has been written, the even-numbered row is written. During writing in the even-numbered row, the write transistor SST is turned off in the odd-numbered row to be in a "waiting" state. Since a video signal line SL sharing the video signal Vsig is common to the pixel circuits PX in a plurality of rows belonging to the same column, the video signal writing operation is sequentially performed for each row.

[Light Emission]

Figure 10:
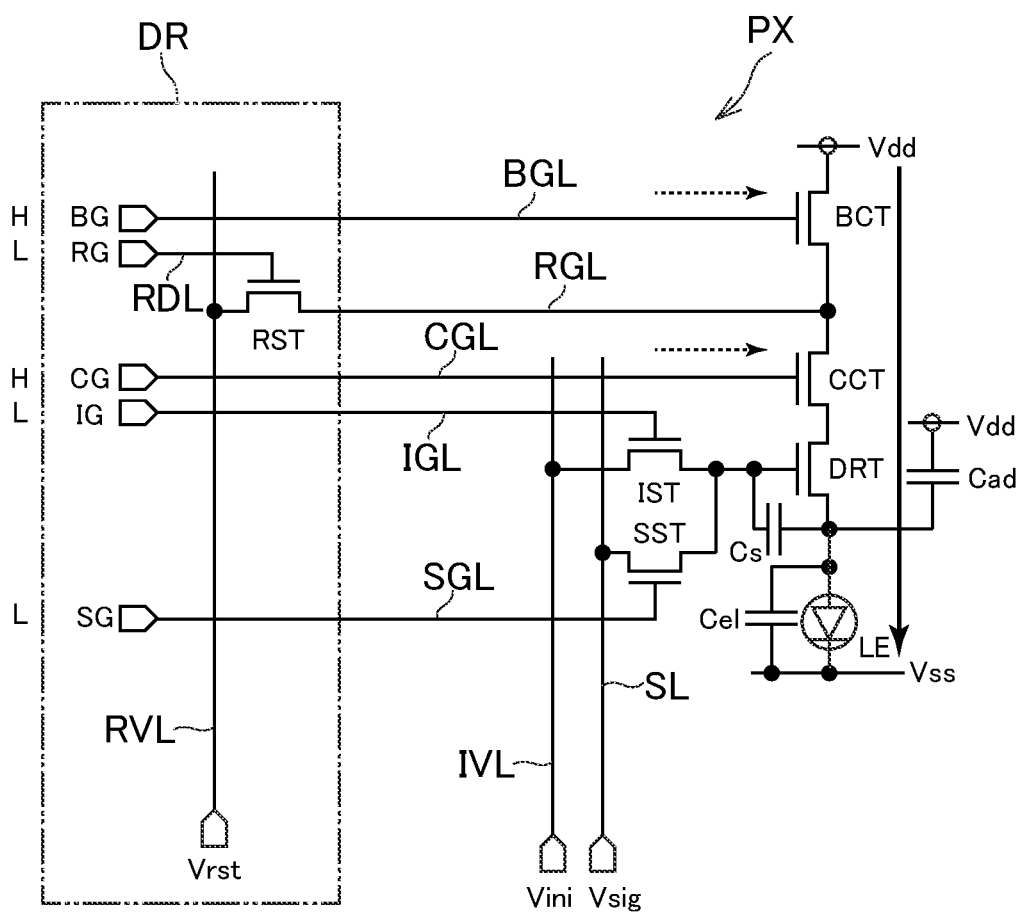
FIG. 10 is a diagram illustrating an operation in Period 6 in FIG. 5.

FIG. 10 is a diagram illustrating the operation in Period 6 in FIG. 5. In this period, the signal CG is at the H level and the signal SG is at the L level, the correction transistor CCT is turned on, and the write transistor SST is turned off. A current is supplied from the power supply voltage Vdd to the drive transistor DRT through the light emission control transistor BCT and the correction transistor CCT.

The drive transistor DRT causes a current corresponding to the gate-source voltage $V_{GS}$ set up to the previous stage to flow into the light emitting element LE, and the light emitting element LE emits light with a luminance corresponding to the current. At this time, the voltage between the anode and the cathode of the light emitting element LE becomes a voltage corresponding to the current, so that the potential on the anode side increases, and the voltage between the gate and the source of the drive transistor DRT is held by the storage capacitor Cs. The gate potential of the drive transistor DRT also increases due to the coupling of the storage capacitor Cs.

Actually, since the gate of the drive transistor DRT has not only the storage capacitor Cs but also the additional capacitor Cad and another parasitic capacitor, the increase of the gate potential of the drive transistor DRT is slightly smaller than the potential increase on the anode side. Since this value is known, the potential of the video signal Vsig may be determined so that the final voltage between the gate and the source of the drive transistor DRT becomes a desired current value.

Thus, a series of operations of the pixel is completed. When the operation is completed from the first row to the last row, one screen within one frame period is displayed. Thereafter, the operation is repeated to display an image.

As illustrated in FIG. 3, the plurality of control lines GL include a plurality of first control lines GL1 and a plurality of second control lines GL2. The plurality of first control lines GL1 extend in the first direction D1 through the first area A1, avoiding the second area A2. The plurality of second control lines GL2 extend in the first direction D1 through the second area A2 and the non-display area NDA, avoiding the first area A1. The plurality of first control lines GL1 (the plurality of second control lines GL2) form a group G for pixel circuits PX arranged in a line in the first direction D1. The control lines of each group G are composed of different types of control lines (the emission control line BGL, the correction control line CGL, the initialization control line IGL, the write control line SGL, and the reset control line RGL). Different groups G include the same type of control lines.

The plurality of first control lines GL1 are arranged such that control lines of different types belonging to each group G are adjacent to each other. The plurality of second control lines GL2 are also arranged in the second area A2 such that control lines of different types belonging to each group G are adjacent to each other.

Some (for example, all) of the plurality of second control lines GL2 extend in the first direction D1 from the second area A2 to the non-display area NDA, and bend in the second direction D2 in the non-display area NDA. In the non-display area NDA, the plurality of second control lines GL2 are arranged such that control lines of the same type belonging to different groups G are adjacent to each other.

A plurality of capacitor electrodes CE are provided in the non-display area NDA. The capacitor electrode CE is composed of a semiconductor layer to which a high concentration of impurities is added. A semiconductor layer that is made conductive by adding an n-type impurity is advantageous for applying the low voltage Vss and a semiconductor layer that is made conductive by adding a p-type impurity is advantageous for applying the high voltage Vdd. The capacitor electrode CE is in the same layer as the semiconductor layer 18 of the thin film transistor TR illustrated in FIG. 2. The capacitor electrode CE is connected to the low potential power supply voltage Vss via a power supply line PL.

The capacitor electrode CE (for example, each of the plurality of capacitor electrodes CE) faces the plurality of second control lines GL2 in the non-display area NDA. The capacitor electrode CE includes a plurality of portions P that are connected to each other and arranged in the second direction D2. Each of the plurality of portions P faces each other for control lines of the same type adjacent in the non-display area NDA. One of the plurality of portions P and the other are different in the width in the first direction D1. All the sizes of the plurality of portions P may be different from each other in the first direction D1. For example, the width in the first direction D1 is larger in the order of a portion P1 facing a plurality of write control lines SGL, a portion P2 facing a plurality of correction control lines CGL, a portion P3 facing a plurality of light emission control lines BGL, a portion P4 facing a plurality of initialization control lines IGL, and a portion P5 facing the plurality of reset control lines RGL.

An insulating film (for example, the gate insulating film 20 and the interlayer insulating film 24 illustrated in FIG. 2) is interposed between the second control line GL2 and the capacitor electrode CE to form the capacitance C. By forming the capacitor in the non-display area NDA, the load on the second control line GL2 can be made closer (for example, matched) to the load on the first control line GL1. On the capacitor electrode CE, there are the gate insulating film 20 and the interlayer insulating film 24 illustrated in FIG. 2 as insulating films. The light emission control line BGL, the correction control line CGL, the initialization control line IGL, and the write control line SGL are mounted on the gate insulating film 20 as an insulating film. The reset control line RGL is mounted on the gate insulating film 20 and the interlayer insulating film 24 (see FIG. 2) as an insulating film.

The larger the facing area between the capacitor electrode CE and the control line, the larger the capacitance C. The capacitances C1, C2, C3, C4, and C5 respectively corresponding to the plurality of portions P1, P2, P3, P4, and P5 of the capacitor electrode CE are larger in this order. In the non-display area NDA, the plurality of second control lines GL2 are arranged such that control lines of the same type are adjacent to each other, and thus, load adjustment can be simplified.

Second Embodiment

Figure 11:
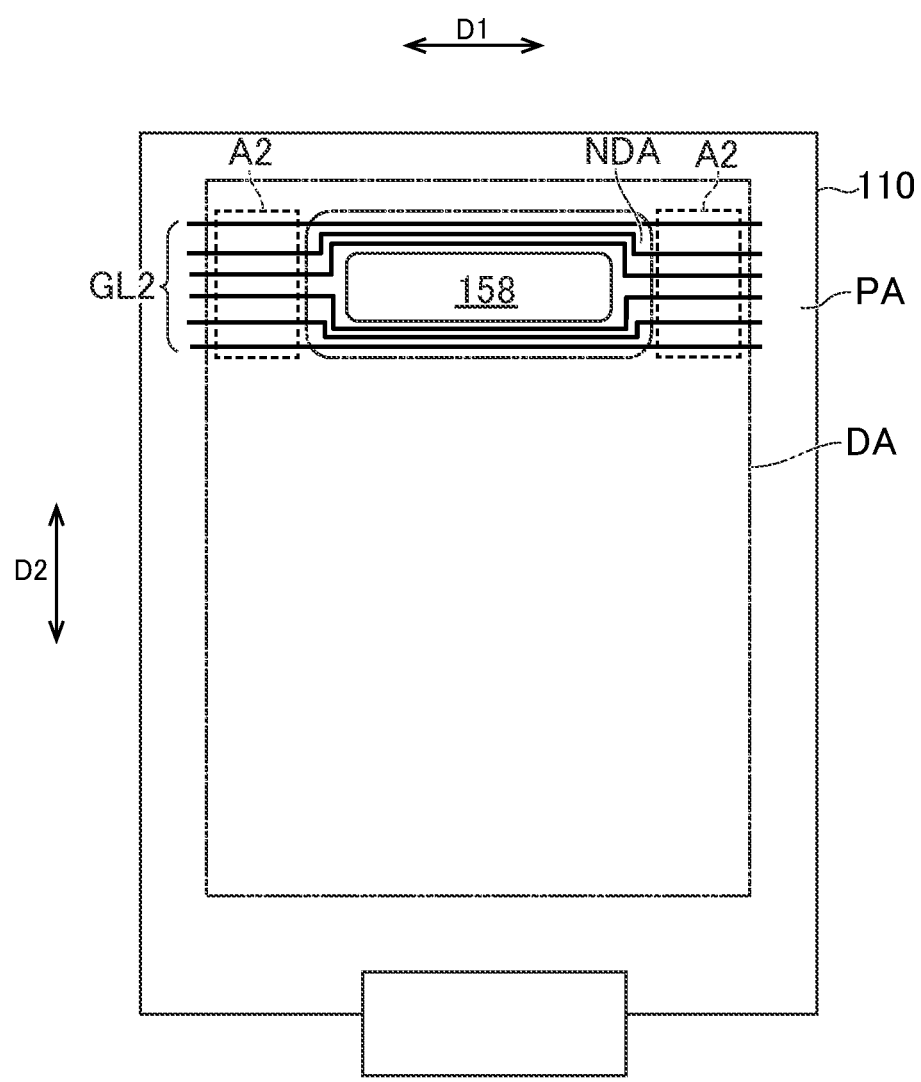
FIG. 11 is a plan view illustrating a display device according to a second embodiment to which the present invention is applied.

FIG. 11 is a plan view illustrating a display device according to a second embodiment to which the present invention is applied. In the present embodiment, a substrate 110 includes a display area DA, a peripheral area PA around the display area DA, and a non-display area NDA. The non-display area NDA is provided so as to be surrounded by the display area DA. An opening 158 of the substrate 110 is surrounded by the non-display area NDA.

The plurality of second control lines GL2 are sorted so as to pass through both sides of the opening 158 in the second direction D2. One of the plurality of second control lines GL2 extends to one side of the opening 158, and the other extends to the opposite side thereof. Some of the plurality of second control lines GL2 extend in the first direction D1 from the second area A2 to the non-display area NDA, and bend in the first direction D1 next to the opening 158 so as to avoid the opening 158. The other contents correspond to the contents described in the first embodiment.

The display device is not limited to the organic electroluminescence display device, and may be a display device including a light emitting element such as a quantum-dot light emitting diode (QLED) in each pixel, or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. A thin film transistor (TFT) substrate comprising:
an active area having a non-rectangular shape in which a first area and a second area are joined, the second area being smaller than the first area in a first direction, and the second area being adjacent to the first area in a second direction orthogonal to the first direction;
a non-active area adjacent to the second area in the first direction and adjacent to the first area in the second direction;
a plurality of circuit units arranged in the active area in the first direction and the second direction, avoiding the non-active area;
a plurality of first control lines each extending in the first direction through the first area, avoiding the second area;
a plurality of second control lines each extending in the first direction through the second area and the non-active area, avoiding the first area;
a capacitor electrode facing the plurality of second control lines in the non-active area; and
an insulating film interposed between the plurality of second control lines and the capacitor electrode, wherein
a control line assembly of each set of the plurality of first control lines and the plurality of second control lines is divided into a plurality of groups each constituted of different types of control line assemblies connected to a corresponding assembly of the plurality of circuit units, and different groups include the same type of control line assemblies,
the plurality of first control lines are arranged such that control line assemblies of the different types belonging to each of the plurality of groups are adjacent to each other,
the plurality of second control lines are arranged in the second area such that control line assemblies of the different types belonging to each of the plurality of groups are adjacent to each other, and
the plurality of second control lines are arranged in the non-active area such that control line assemblies of the same type belonging to the different groups are adjacent to each other.

2. The thin film transistor substrate according to claim 1, wherein
the capacitor electrode includes a plurality of portions connected to each other and arranged in the second direction,
the plurality of portions face each other in control line assemblies of the same type adjacent in the non-active area, and
one of the plurality of portions and the other pluralities of portions are different in width in the first direction.

3. The thin film transistor substrate according to claim 1, wherein
the capacitor electrode is a plurality of capacitor electrodes.

4. The thin film transistor substrate according to claim 1, wherein
the active area includes the second area at an end in the second direction.

5. The thin film transistor substrate according to claim 4, wherein
the thin film transistor substrate includes a notch, and
the notch is not adjacent to the second area in the second direction and is adjacent to the non-active area in the second direction.

6. The thin film transistor substrate according to claim 5, wherein
the second area includes a front end in the second direction, and the notch is adjacent to the front end of the second area in the first direction.

7. The thin film transistor substrate according to claim 1, wherein
the plurality of second control lines extend in the first direction from the second area to the non-active area and include portions that are bent in the non-active area in the second direction.

8. The thin film transistor substrate according to claim 1, wherein
the non-active area is provided to be surrounded by the active area.

9. The thin film transistor substrate according to claim 8, wherein
the substrate includes an opening surrounded by the non-active area.

10. The thin film transistor substrate according to claim 9, wherein
one of the plurality of second control lines extends to one side of the opening, and
another one of the plurality of second control lines extends to an opposite side of the opening from the one of the plurality of second control lines.

11. The thin film transistor substrate according to claim 9, wherein
the plurality of second control lines extend in the first direction from the second area to the non-active area, and
the plurality of second control lines include portions that are bent in the first direction next to the opening to avoid the opening.

* * * * *